(12) United States Patent
Sella et al.

(10) Patent No.: US 9,748,897 B2
(45) Date of Patent: Aug. 29, 2017

(54) ELECTRICALLY ISOLATED HEAT DISSIPATING JUNCTION BOX

(71) Applicant: Solaredge Technologies Ltd., Hod Hasharon (IL)

(72) Inventors: Guy Sella, Bitan Aharon (IL); Lior Handelsman, Givataim (IL); Vadim Shmukler, Rishon-Lezion (IL); Meir Adest, Raanana (IL); Meir Gazit, Ashkelon (IL); Yoav Galin, Raanana (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 14/997,079

(22) Filed: Jan. 15, 2016

(65) Prior Publication Data

US 2016/0134234 A1 May 12, 2016

Related U.S. Application Data

(63) Continuation of application No. 14/641,690, filed on Mar. 9, 2015, which is a continuation of application
(Continued)

(51) Int. Cl.
*H05K 5/06* (2006.01)
*H02S 40/34* (2014.01)
(Continued)

(52) U.S. Cl.
CPC .......... *H02S 40/34* (2014.12); *G08B 13/1409* (2013.01); *H02G 15/10* (2013.01);
(Continued)

(58) Field of Classification Search
USPC ........................................................ 174/50
See application file for complete search history.

(56) References Cited

U.S. PATENT DOCUMENTS 3,369,210 A 2/1968 Manickella
3,596,229 A 7/1971 Hohorst
(Continued)

FOREIGN PATENT DOCUMENTS

CN 86200903 U 1/1987
CN 1236213 A 11/1999
(Continued)

OTHER PUBLICATIONS

Ciobotaru, et al., Control of single-stage single-phase PV inverter, Aug. 7, 2006.
(Continued)

*Primary Examiner* — Dhirubhai R Patel
(74) *Attorney, Agent, or Firm* — Banner & Witcoff, Ltd.

(57) ABSTRACT

A junction box used for making electrical connections to a photovoltaic panel. The junction box has two chambers including a first chamber and a second chamber and a wall common to and separating both chambers. The wall may be adapted to have an electrical connection therethrough. The two lids are adapted to seal respectively the two chambers. The two lids are on opposite sides of the junction box relative to the photovoltaic panel. The two lids may be attachable using different sealing processes to a different level of hermeticity. The first chamber may be adapted to receive a circuit board for electrical power conversion. The junction box may include supports for mounting a printed circuit board in the first chamber. The second chamber is configured for electrical connection to the photovoltaic panel. A metal heat sink may be bonded inside the first chamber.

17 Claims, 4 Drawing Sheets

Related U.S. Application Data

No. 13/901,706, filed on May 24, 2013, now Pat. No. 9,006,569, which is a continuation of application No. 12/785,773, filed on May 24, 2010, now Pat. No. 8,476,524.

(60) Provisional application No. 61/180,455, filed on May 22, 2009.

(51) Int. Cl.
*G08B 13/14* (2006.01)
*H05K 5/02* (2006.01)
*H05K 7/20* (2006.01)
*H05K 9/00* (2006.01)
*H02G 15/10* (2006.01)

(52) U.S. Cl.
CPC ............ *H02S 40/345* (2014.12); *H05K 5/02* (2013.01); *H05K 5/062* (2013.01); *H05K 7/2039* (2013.01); *H05K 9/0007* (2013.01); *H05K 9/0009* (2013.01); *H05K 9/0015* (2013.01); *Y02E 10/50* (2013.01); *Y10S 248/906* (2013.01); *Y10T 29/49117* (2015.01)

(56) References Cited

U.S. PATENT DOCUMENTS

| | | | |
|---|---|---|---|
| 4,060,757 A | 11/1977 | McMurray | |
| 4,101,816 A | 7/1978 | Shepter | |
| 4,171,861 A | 10/1979 | Hohorst | |
| 4,452,867 A | 6/1984 | Conforti | |
| 4,460,232 A | 7/1984 | Sotolongo | |
| 4,481,654 A | 11/1984 | Daniels et al. | |
| 4,598,330 A | 7/1986 | Woodworth | |
| 4,623,753 A | 11/1986 | Feldman et al. | |
| 4,637,677 A | 1/1987 | Barkus | |
| 4,641,042 A | 2/1987 | Miyazawa | |
| 4,641,079 A | 2/1987 | Kato et al. | |
| 4,644,458 A | 2/1987 | Harafuji et al. | |
| 4,652,770 A | 3/1987 | Kumano | |
| 4,783,728 A | 11/1988 | Hoffman | |
| RE33,057 E | 9/1989 | Clegg et al. | |
| 4,868,379 A | 9/1989 | West | |
| 4,888,063 A | 12/1989 | Powell | |
| 4,888,702 A | 12/1989 | Gerken et al. | |
| 4,899,269 A | 2/1990 | Rouzies | |
| 4,945,559 A * | 7/1990 | Collins | H02G 3/14 379/413 |
| 4,987,360 A | 1/1991 | Thompson | |
| 5,045,988 A | 9/1991 | Gritter et al. | |
| 5,081,558 A | 1/1992 | Mahler | |
| 5,191,519 A | 3/1993 | Kawakami | |
| 5,280,232 A | 1/1994 | Kohl et al. | |
| 5,327,071 A | 7/1994 | Frederick et al. | |
| 5,345,375 A | 9/1994 | Mohan | |
| 5,391,235 A | 2/1995 | Inoue | |
| 5,402,060 A | 3/1995 | Erisman | |
| 5,446,645 A | 8/1995 | Shirahama et al. | |
| 5,460,546 A | 10/1995 | Kunishi et al. | |
| 5,493,154 A | 2/1996 | Smith et al. | |
| 5,497,289 A | 3/1996 | Sugishima et al. | |
| 5,517,378 A | 5/1996 | Asplund et al. | |
| 5,548,504 A | 8/1996 | Takehara | |
| 5,604,430 A | 2/1997 | Decker et al. | |
| 5,616,913 A | 4/1997 | Litterst | |
| 5,644,219 A | 7/1997 | Kurokawa | |
| 5,646,501 A | 7/1997 | Fishman et al. | |
| 5,659,465 A | 8/1997 | Flack et al. | |
| 5,686,766 A | 11/1997 | Tamechika | |
| 5,726,505 A | 3/1998 | Yamada et al. | |
| 5,773,963 A | 6/1998 | Blanc et al. | |
| 5,780,092 A | 7/1998 | Agbo et al. | |
| 5,798,631 A | 8/1998 | Spee et al. | |
| 5,801,519 A | 9/1998 | Midya et al. | |
| 5,804,894 A | 9/1998 | Leeson et al. | |
| 5,821,734 A | 10/1998 | Faulk | |
| 5,822,186 A | 10/1998 | Bull et al. | |
| 5,838,148 A | 11/1998 | Kurokami et al. | |
| 5,869,956 A | 2/1999 | Nagao et al. | |
| 5,873,738 A | 2/1999 | Shimada et al. | |
| 5,892,354 A | 4/1999 | Nagao et al. | |
| 5,905,645 A | 5/1999 | Cross | |
| 5,919,314 A | 7/1999 | Kim | |
| 5,923,158 A | 7/1999 | Kurokami et al. | |
| 5,932,994 A | 8/1999 | Jo et al. | |
| 5,945,806 A | 8/1999 | Faulk | |
| 5,949,668 A | 9/1999 | Schweighofer | |
| 5,963,010 A | 10/1999 | Hayashi et al. | |
| 5,990,659 A | 11/1999 | Frannhagen | |
| 6,031,736 A | 2/2000 | Takehara et al. | |
| 6,038,148 A | 3/2000 | Farrington et al. | |
| 6,046,919 A | 4/2000 | Madenokouji et al. | |
| 6,050,779 A | 4/2000 | Nagao et al. | |
| 6,078,511 A | 6/2000 | Fasullo et al. | |
| 6,081,104 A | 6/2000 | Kern | |
| 6,082,122 A | 7/2000 | Madenokouji et al. | |
| 6,111,188 A | 8/2000 | Kurokami et al. | |
| 6,111,391 A | 8/2000 | Cullen | |
| 6,111,767 A | 8/2000 | Handleman | |
| 6,163,086 A | 12/2000 | Choo | |
| 6,166,455 A | 12/2000 | Li | |
| 6,166,527 A | 12/2000 | Dwelley et al. | |
| 6,169,678 B1 | 1/2001 | Kondo et al. | |
| 6,219,623 B1 | 4/2001 | Wills | |
| 6,255,360 B1 | 7/2001 | Domschke et al. | |
| 6,259,234 B1 | 7/2001 | Perol | |
| 6,262,558 B1 | 7/2001 | Weinberg | |
| 6,285,572 B1 | 9/2001 | Onizuka et al. | |
| 6,301,128 B1 | 10/2001 | Jang et al. | |
| 6,304,065 B1 | 10/2001 | Wittenbreder | |
| 6,320,769 B2 | 11/2001 | Kurokami et al. | |
| 6,339,538 B1 | 1/2002 | Handleman | |
| 6,344,612 B1 | 2/2002 | Kuwahara et al. | |
| 6,351,130 B1 | 2/2002 | Preiser et al. | |
| 6,369,462 B1 | 4/2002 | Siri | |
| 6,380,719 B2 | 4/2002 | Underwood et al. | |
| 6,396,170 B1 | 5/2002 | Laufenberg et al. | |
| 6,433,522 B1 | 8/2002 | Siri | |
| 6,448,489 B2 | 9/2002 | Kimura et al. | |
| 6,452,814 B1 | 9/2002 | Wittenbreder | |
| 6,493,246 B2 | 12/2002 | Suzui et al. | |
| 6,507,176 B2 | 1/2003 | Wittenbreder, Jr. | |
| 6,531,848 B1 | 3/2003 | Chitsazan et al. | |
| 6,545,211 B1 | 4/2003 | Mimura | |
| 6,548,205 B2 | 4/2003 | Leung et al. | |
| 6,590,793 B1 | 7/2003 | Nagao et al. | |
| 6,593,521 B2 | 7/2003 | Kobayashi | |
| 6,600,100 B2 | 7/2003 | Ho et al. | |
| 6,608,468 B2 | 8/2003 | Nagase | |
| 6,611,441 B2 | 8/2003 | Kurokami et al. | |
| 6,628,011 B2 | 9/2003 | Droppo et al. | |
| 6,650,560 B2 | 11/2003 | MacDonald et al. | |
| 6,653,549 B2 | 11/2003 | Matsushita et al. | |
| 6,655,987 B2 * | 12/2003 | Higashikozono | H01R 9/2425 439/535 |
| 6,678,174 B2 | 1/2004 | Suzui et al. | |
| 6,690,590 B2 | 2/2004 | Stamenic et al. | |
| 6,738,692 B2 | 5/2004 | Schienbein et al. | |
| 6,765,315 B2 | 7/2004 | Hammerstrom et al. | |
| 6,768,047 B2 | 7/2004 | Chang et al. | |
| 6,788,033 B2 | 9/2004 | Vinciarelli | |
| 6,795,318 B2 | 9/2004 | Haas et al. | |
| 6,801,442 B2 | 10/2004 | Suzui et al. | |
| 6,828,503 B2 * | 12/2004 | Yoshikawa | H01R 9/2425 174/50 |
| 6,850,074 B2 | 2/2005 | Adams et al. | |
| 6,882,131 B1 | 4/2005 | Takada et al. | |
| 6,914,418 B2 | 7/2005 | Sung | |
| 6,919,714 B2 | 7/2005 | Delepaut | |
| 6,927,955 B2 | 8/2005 | Suzui et al. | |
| 6,933,627 B2 | 8/2005 | Wilhelm | |
| 6,936,995 B2 | 8/2005 | Kapsokavathis et al. | |
| 6,950,323 B2 | 9/2005 | Achleitner et al. | |

(56) References Cited

U.S. PATENT DOCUMENTS

| | | |
|---|---|---|
| 6,963,147 B2 | 11/2005 | Kurokami et al. |
| 6,984,967 B2 | 1/2006 | Notman |
| 6,984,970 B2 | 1/2006 | Capel |
| 7,030,597 B2 | 4/2006 | Bruno et al. |
| 7,031,176 B2 | 4/2006 | Kotsopoulos et al. |
| 7,042,195 B2 | 5/2006 | Tsunetsugu et al. |
| 7,046,531 B2 | 5/2006 | Zocchi et al. |
| 7,053,506 B2 | 5/2006 | Alonso et al. |
| 7,072,194 B2 | 7/2006 | Nayar et al. |
| 7,079,406 B2 | 7/2006 | Kurokami et al. |
| 7,087,332 B2 | 8/2006 | Harris |
| 7,090,509 B1 | 8/2006 | Gilliland et al. |
| 7,091,707 B2 | 8/2006 | Cutler |
| 7,097,516 B2 | 8/2006 | Werner et al. |
| 7,126,053 B2 | 10/2006 | Kurokami et al. |
| 7,126,294 B2 | 10/2006 | Minami et al. |
| 7,138,786 B2 | 11/2006 | Ishigaki et al. |
| 7,148,669 B2 | 12/2006 | Maksimovic et al. |
| 7,154,755 B2 * | 12/2006 | Araujo ............... H05K 5/0008 174/50 |
| 7,158,359 B2 | 1/2007 | Bertele et al. |
| 7,158,395 B2 | 1/2007 | Deng et al. |
| 7,174,973 B1 | 2/2007 | Lysaght |
| 7,193,872 B2 | 3/2007 | Siri |
| 7,218,541 B2 | 5/2007 | Price et al. |
| 7,248,946 B2 | 7/2007 | Bashaw et al. |
| 7,256,566 B2 | 8/2007 | Bhavaraju et al. |
| 7,277,304 B2 | 10/2007 | Stancu et al. |
| 7,282,814 B2 | 10/2007 | Jacobs |
| 7,291,036 B1 | 11/2007 | Daily et al. |
| RE39,976 E | 1/2008 | Schiff et al. |
| 7,336,056 B1 | 2/2008 | Dening |
| 7,352,154 B2 | 4/2008 | Cook |
| 7,371,963 B2 | 5/2008 | Suenaga et al. |
| 7,372,712 B2 | 5/2008 | Stancu et al. |
| 7,385,380 B2 | 6/2008 | Ishigaki et al. |
| 7,385,833 B2 | 6/2008 | Keung |
| 7,394,237 B2 | 7/2008 | Chou et al. |
| 7,420,815 B2 | 9/2008 | Love |
| 7,471,014 B2 | 12/2008 | Lum et al. |
| 7,589,437 B2 | 9/2009 | Henne et al. |
| 7,622,802 B2 | 11/2009 | Paulus et al. |
| 7,646,116 B2 | 1/2010 | Batarseh et al. |
| 7,719,140 B2 | 5/2010 | Ledenev et al. |
| 7,759,575 B2 | 7/2010 | Jones et al. |
| 7,763,807 B2 | 7/2010 | Richter |
| 7,772,716 B2 | 8/2010 | Shaver, II et al. |
| 7,782,031 B2 | 8/2010 | Qiu et al. |
| 7,787,273 B2 | 8/2010 | Lu et al. |
| 7,804,282 B2 | 9/2010 | Bertele |
| 7,812,701 B2 | 10/2010 | Lee et al. |
| 7,824,189 B1 | 11/2010 | Lauermann et al. |
| 7,868,599 B2 | 1/2011 | Rahman et al. |
| 7,880,334 B2 | 2/2011 | Evans et al. |
| 7,893,346 B2 | 2/2011 | Nachamkin et al. |
| 7,948,221 B2 | 5/2011 | Watanabe et al. |
| 7,952,897 B2 | 5/2011 | Nocentini et al. |
| 7,960,650 B2 | 6/2011 | Richter et al. |
| 8,003,885 B2 | 8/2011 | Richter et al. |
| 8,035,249 B2 | 10/2011 | Shaver, II et al. |
| 8,097,818 B2 | 1/2012 | Gerull et al. |
| 8,204,709 B2 | 6/2012 | Presher, Jr. et al. |
| 8,222,533 B2 * | 7/2012 | Gherardini ............. H02S 40/345 174/260 |
| 8,248,804 B2 | 8/2012 | Han et al. |
| 8,289,183 B1 | 10/2012 | Foss |
| 8,294,451 B2 | 10/2012 | Hasenfus |
| 8,303,349 B2 * | 11/2012 | Shmukler .......... H01R 13/2435 439/724 |
| 8,324,921 B2 | 12/2012 | Adest et al. |
| 8,378,656 B2 | 2/2013 | de Rooij et al. |
| 8,410,950 B2 | 4/2013 | Takehara et al. |
| 8,427,009 B2 | 4/2013 | Shaver, II et al. |
| 8,710,351 B2 | 4/2014 | Robbins |
| 8,785,771 B2 | 7/2014 | Dunkleberger et al. |
| 8,816,535 B2 | 8/2014 | Adest et al. |
| 8,823,218 B2 | 9/2014 | Hadar et al. |
| 8,835,748 B2 | 9/2014 | Frolov et al. |
| 8,878,563 B2 | 11/2014 | Robbins |
| 8,963,375 B2 | 2/2015 | DeGraaff |
| 2002/0044473 A1 | 4/2002 | Toyomura et al. |
| 2002/0056089 A1 | 5/2002 | Houston |
| 2003/0058593 A1 | 3/2003 | Bertele et al. |
| 2003/0066076 A1 | 4/2003 | Minahan |
| 2003/0075211 A1 | 4/2003 | Makita et al. |
| 2003/0080741 A1 | 5/2003 | LeRow et al. |
| 2003/0214274 A1 | 11/2003 | Lethellier |
| 2004/0041548 A1 | 3/2004 | Perry |
| 2004/0125618 A1 | 7/2004 | De Rooij et al. |
| 2004/0140719 A1 | 7/2004 | Vulih et al. |
| 2004/0169499 A1 | 9/2004 | Huang et al. |
| 2004/0201279 A1 | 10/2004 | Templeton |
| 2004/0201933 A1 | 10/2004 | Blanc |
| 2004/0246226 A1 | 12/2004 | Moon |
| 2005/0002214 A1 | 1/2005 | Deng et al. |
| 2005/0005785 A1 | 1/2005 | Poss et al. |
| 2005/0017697 A1 | 1/2005 | Capel |
| 2005/0057214 A1 | 3/2005 | Matan |
| 2005/0057215 A1 | 3/2005 | Matan |
| 2005/0068820 A1 | 3/2005 | Radosevich et al. |
| 2005/0099138 A1 | 5/2005 | Wilhelm |
| 2005/0103376 A1 | 5/2005 | Matsushita et al. |
| 2005/0162018 A1 | 7/2005 | Realmuto et al. |
| 2005/0172995 A1 | 8/2005 | Rohrig et al. |
| 2005/0226017 A1 | 10/2005 | Kotsopoulos et al. |
| 2006/0001406 A1 | 1/2006 | Matan |
| 2006/0017327 A1 | 1/2006 | Siri et al. |
| 2006/0034106 A1 | 2/2006 | Johnson |
| 2006/0038692 A1 | 2/2006 | Schnetker |
| 2006/0053447 A1 | 3/2006 | Krzyzanowski et al. |
| 2006/0068239 A1 | 3/2006 | Norimatsu et al. |
| 2006/0108979 A1 | 5/2006 | Daniel et al. |
| 2006/0113843 A1 | 6/2006 | Beveridge |
| 2006/0113979 A1 | 6/2006 | Ishigaki et al. |
| 2006/0118162 A1 | 6/2006 | Saelzer et al. |
| 2006/0132102 A1 | 6/2006 | Harvey |
| 2006/0149396 A1 | 7/2006 | Templeton |
| 2006/0162772 A1 | 7/2006 | Presher et al. |
| 2006/0163946 A1 | 7/2006 | Henne et al. |
| 2006/0171182 A1 | 8/2006 | Siri et al. |
| 2006/0174939 A1 | 8/2006 | Matan |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0227578 A1 | 10/2006 | Datta et al. |
| 2006/0235717 A1 | 10/2006 | Sharma et al. |
| 2006/0237058 A1 | 10/2006 | McClintock et al. |
| 2007/0044837 A1 | 3/2007 | Simburger et al. |
| 2007/0075711 A1 | 4/2007 | Blanc et al. |
| 2007/0081364 A1 | 4/2007 | Andreycak |
| 2007/0159866 A1 | 7/2007 | Siri |
| 2007/0164750 A1 | 7/2007 | Chen et al. |
| 2007/0165347 A1 | 7/2007 | Wendt et al. |
| 2007/0205778 A1 | 9/2007 | Fabbro et al. |
| 2007/0227574 A1 | 10/2007 | Cart |
| 2007/0236187 A1 | 10/2007 | Wai et al. |
| 2007/0273342 A1 | 11/2007 | Kataoka et al. |
| 2008/0024098 A1 | 1/2008 | Hojo |
| 2008/0088184 A1 | 4/2008 | Tung et al. |
| 2008/0097655 A1 | 4/2008 | Hadar et al. |
| 2008/0106250 A1 | 5/2008 | Prior et al. |
| 2008/0142071 A1 | 6/2008 | Dorn et al. |
| 2008/0143188 A1 | 6/2008 | Adest et al. |
| 2008/0143462 A1 | 6/2008 | Belisle et al. |
| 2008/0147335 A1 | 6/2008 | Adest et al. |
| 2008/0150366 A1 | 6/2008 | Adest et al. |
| 2008/0179949 A1 | 7/2008 | Besser et al. |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0246460 A1 | 10/2008 | Smith |
| 2008/0246463 A1 | 10/2008 | Sinton et al. |
| 2008/0291609 A1 | 11/2008 | Victor et al. |
| 2009/0073726 A1 | 3/2009 | Babcock |

(56) References Cited

U.S. PATENT DOCUMENTS

| | | | |
|---|---|---|---|
| 2009/0084570 | A1 | 4/2009 | Gherardini et al. |
| 2009/0097172 | A1 | 4/2009 | Bremicker et al. |
| 2009/0102440 | A1 | 4/2009 | Coles |
| 2009/0141522 | A1 | 6/2009 | Adest et al. |
| 2009/0182532 | A1 | 7/2009 | Stoeber et al. |
| 2009/0190275 | A1 | 7/2009 | Gilmore et al. |
| 2009/0242011 | A1 | 10/2009 | Proisy et al. |
| 2009/0283129 | A1 | 11/2009 | Foss |
| 2009/0325003 | A1 | 12/2009 | Aberle et al. |
| 2010/0020576 | A1 | 1/2010 | Falk |
| 2010/0071742 | A1 | 3/2010 | de Rooij et al. |
| 2010/0124087 | A1 | 5/2010 | Falk |
| 2010/0139743 | A1 | 6/2010 | Hadar et al. |
| 2010/0154858 | A1 | 6/2010 | Jain |
| 2010/0206378 | A1 | 8/2010 | Erickson, Jr. et al. |
| 2010/0214808 | A1 | 8/2010 | Rodriguez |
| 2010/0241375 | A1 | 9/2010 | Kumar et al. |
| 2010/0244575 | A1 | 9/2010 | Coccia et al. |
| 2010/0301991 | A1 | 12/2010 | Sella et al. |
| 2011/0006743 | A1 | 1/2011 | Fabbro |
| 2011/0043172 | A1 | 2/2011 | Dearn |
| 2011/0068633 | A1 | 3/2011 | Quardt et al. |
| 2011/0108087 | A1 | 5/2011 | Croft et al. |
| 2011/0125431 | A1 | 5/2011 | Adest et al. |
| 2011/0133552 | A1 | 6/2011 | Binder et al. |
| 2011/0198935 | A1 | 8/2011 | Hinman et al. |
| 2011/0240100 | A1 | 10/2011 | Lu et al. |
| 2011/0254372 | A1 | 10/2011 | Haines et al. |
| 2011/0267859 | A1 | 11/2011 | Chapman |
| 2011/0290317 | A1 | 12/2011 | Naumovitz et al. |
| 2012/0043818 | A1 | 2/2012 | Stratakos et al. |
| 2012/0080943 | A1 | 4/2012 | Phadke |
| 2012/0138123 | A1 | 6/2012 | Newdoll et al. |
| 2012/0139343 | A1 | 6/2012 | Adest et al. |
| 2012/0194003 | A1 | 8/2012 | Schmidt et al. |
| 2012/0199172 | A1 | 8/2012 | Avrutsky |
| 2013/0038124 | A1 | 2/2013 | Newdoll et al. |
| 2013/0049710 | A1 | 2/2013 | Kraft et al. |
| 2013/0082724 | A1 | 4/2013 | Noda et al. |
| 2013/0321013 | A1 | 12/2013 | Pisklak et al. |

FOREIGN PATENT DOCUMENTS

| | | | |
|---|---|---|---|
| CN | 201207557 Y | 3/2000 | |
| CN | 1577980 A | 2/2005 | |
| CN | 1578034 A | 2/2005 | |
| CN | 1700480 A | 11/2005 | |
| CN | 1933315 A | 3/2007 | |
| CN | 200941388 Y | 8/2007 | |
| CN | 101192744 A | 6/2008 | |
| CN | 101388530 A | 3/2009 | |
| CN | 201238275 Y | 5/2009 | |
| CN | 101951190 A | 1/2011 | |
| CN | 101953051 A | 1/2011 | |
| DE | 19737286 A1 | 3/1999 | |
| DE | 10219956 A1 | 4/2003 | |
| DE | 102004053942 A1 | 5/2006 | |
| DE | 102005036153 A1 | 12/2006 | |
| DE | 102005030907 A1 | 1/2007 | |
| DE | 102007051134 A1 | 3/2009 | |
| DE | 102007037130 B3 | 4/2009 | |
| DE | 202009007318 U1 | 8/2009 | |
| DE | 102008057874 A1 | 5/2010 | |
| DE | 102009051186 A1 | 5/2010 | |
| DE | 102009022569 A1 | 12/2010 | |
| EP | 419093 A2 | 3/1991 | |
| EP | 420295 A1 | 4/1991 | |
| EP | 604777 A1 | 7/1994 | |
| EP | 756178 A2 | 1/1997 | |
| EP | 827254 A2 | 3/1998 | |
| EP | 1039361 A1 | 9/2000 | |
| EP | 1330009 A2 | 7/2003 | |
| EP | 1503490 A1 | 2/2005 | |
| EP | 1531545 A2 | 5/2005 | |
| EP | 1657557 A1 | 5/2006 | |
| EP | 1657797 A1 | 5/2006 | |
| EP | 1887675 A2 | 2/2008 | |
| EP | 2048679 A1 | 4/2009 | |
| EP | 2130286 A1 | 12/2009 | |
| EP | 2135296 A2 | 12/2009 | |
| EP | 2256819 A1 | 12/2010 | |
| ES | 2249147 A1 | 3/2006 | |
| ES | 2249149 A1 | 3/2006 | |
| GB | 2128017 A | 4/1984 | |
| GB | 2480015 A | 11/2011 | |
| JP | 61065320 A | 4/1986 | |
| JP | H10308523 A | 11/1998 | |
| JP | 11041832 A | 2/1999 | |
| JP | 11103538 A | 4/1999 | |
| JP | 2003124492 A | 4/2003 | |
| JP | 2003134667 A | 5/2003 | |
| JP | 2003282916 A | 10/2003 | |
| JP | 2006278755 A | 10/2006 | |
| JP | 2007058845 A | 3/2007 | |
| JP | 4174227H B2 | 10/2008 | |
| TW | 200913291 A | 3/2009 | |
| WO | 9313587 A1 | 7/1993 | |
| WO | 9613093 A1 | 5/1996 | |
| WO | 9823021 A2 | 5/1998 | |
| WO | 00/00839 A1 | 1/2000 | |
| WO | 00/21178 A1 | 4/2000 | |
| WO | 0075947 | 12/2000 | |
| WO | 0231517 | 4/2002 | |
| WO | 03050938 A2 | 6/2003 | |
| WO | 03071655 A1 | 8/2003 | |
| WO | 2003098703 | 11/2003 | |
| WO | 2004023278 A2 | 3/2004 | |
| WO | 2004090993 A2 | 10/2004 | |
| WO | 2004107543 A2 | 12/2004 | |
| WO | 2005076444 A1 | 8/2005 | |
| WO | 2005076445 A1 | 8/2005 | |
| WO | 2006005125 A1 | 1/2006 | |
| WO | 2006007198 A1 | 1/2006 | |
| WO | 2006/074561 A1 | 7/2006 | |
| WO | 2006071436 A2 | 7/2006 | |
| WO | 2006078685 A2 | 7/2006 | |
| WO | 2007006564 A2 | 1/2007 | |
| WO | 2007048421 A2 | 5/2007 | |
| WO | 2007073951 A1 | 7/2007 | |
| WO | 2007084196 A2 | 7/2007 | |
| WO | 2007090476 A2 | 8/2007 | |
| WO | 2007113358 A1 | 10/2007 | |
| WO | 2008119034 A1 | 10/2008 | |
| WO | 2008121266 A2 | 10/2008 | |
| WO | 2008125915 A2 | 10/2008 | |
| WO | 2008132551 A2 | 11/2008 | |
| WO | 2008132553 A2 | 11/2008 | |
| WO | 2009011780 A2 | 1/2009 | |
| WO | 2009051870 A1 | 4/2009 | |
| WO | 2009118682 A2 | 10/2009 | |
| WO | 2009118683 A2 | 10/2009 | |
| WO | 2009073868 A1 | 11/2009 | |
| WO | 2009136358 A1 | 11/2009 | |
| WO | 2010065043 A1 | 6/2010 | |
| WO | 2010065388 A1 | 6/2010 | |
| WO | 2010072717 A1 | 7/2010 | |
| WO | 2010078303 A2 | 7/2010 | |
| WO | 20100134057 A1 | 11/2010 | |
| WO | 2011011711 A2 | 1/2011 | |
| WO | 2011017721 A1 | 2/2011 | |
| WO | 2011023732 A2 | 3/2011 | |

OTHER PUBLICATIONS

International Search Report and Written Opinion for PCT/IB2007/004591 dated Jul. 5, 2010.
European Communication for EP07873361.5 dated Jul. 12, 2010.
European Communication for EP07874022.2 dated Oct. 18, 2010.
European Communication for EP07875148.4 dated Oct. 18, 2010.
Chen, et al., "A New Low-Stress Buck-Boost Converter for Universal-Input PFC Applications", IEEE Applied Power Electronics Conference, Feb. 2001, Colorado Power Electronics Center Publications.

(56) References Cited

OTHER PUBLICATIONS

Chen, et al., "Buck-Boost PWM Converters Having Two Independently Controlled Switches", IEEE Power Electronics Specialists Conference, Jun. 2001, Colorado Power Electronics Center Publications.
Esram, et al., "Comparison of Photovoltaic Array Maximum Power Point Tracking Techniques", IEEE Transactions on Energy Conversion, vol. 22, No. 2, Jun. 2007, pp. 439-449.
Walker, et al., "Photovoltaic DC-DC Module Integrated Converter for Novel Cascaded and Bypass Grid Connection Topologies-Design and Optimisation", 37th IEEE Power Electronics Specialists Conference, Jun. 18-22, 2006, Jeju, Korea.
Geoffrey R. Walker Affidavit re: U.S. Appl. No. 11/950,271, signed Aug. 7, 2009.
Geoffrey R. Walker Affidavit re: U.S. Appl. No. 11/951,271, signed Aug. 7, 2009.
International Search Report for PCT/IB2007/004610 dated Feb. 23, 2009.
International Search Report for PCT/IB2007/004584 dated Jan. 28, 2009.
International Search Report for PCT/IB2007/004586 dated Mar. 5, 2009.
International Search Report for PCT/IB2007/004643 dated Jan. 30, 2009.
International Search Report for PCT/US2008/085736 dated Jan. 28, 2009.
International Search Report for PCT/US2008/085754 dated Feb. 9, 2009.
International Search Report for PCT/US2008/085755 dated Feb. 3, 2009.
Kajihara, et al., "Model of Photovoltaic Cell Circuits Under Partial Shading", 2005 IEEE, pp. 866-870.
Knaupp, et al., "Operation of a 10 KW PV Façade with 100 W AC Photovoltaic Modules", 1996 IEEE, 25th PVSC, May 13-17, 1996, pp. 1235-1238, Washington, DC.
Alonso, et al., "Cascaded H-Bridge Multilevel Converter for Grid Connected Photovoltaic Generators with Independent Maximum Power Point Tracking of Each Solor Array", 2003 IEEE 34th, Annual Power Electronics Specialists Conference, Acapulco, Mexico, Jun. 15-19, 2003, pp. 731-735, vol. 2.
Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.
Chen, et al., "Predictive Digital Current Programmed Control", IEEE Transactions on Power Electronics, vol. 18, Issue 1, Jan. 2003.
Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.
Alonso, "A New Distributed Converter Interface for PV Panels", 20th European Photovoltaic Solar Energy Conference, Jun. 6-10, 2005, Barcelona, Spain, pp. 2288-2291.
Alonso, "Experimental Results of Intelligent PV Module for Grid-Connected PV Systems", 21st European Photovoltaic Solar Energy Conference, Sep. 4-8, 2006, Dresden, Germany, pp. 2297-2300.
Enslin, "Integrated Photovoltaic Maximum Power Point Tracking Converter", IEEE Transactions on Industrial Electronics, vol. 44, No. 6, Dec. 1997, pp. 769-773.
Lindgren, "Topology for Decentralised Solar Energy Inverters with a Low Voltage AC-Bus", Chalmers University of Technology, Department of Electrical Power Engineering, EPE '99—Lausanne.
Nikraz, "Digital Control of a Voltage Source Inverter in a Photovoltaic Applications", 2004 35th Annual IEEE Power Electronics Specialists Conference, Aachen, Germany, 2004, pp. 3266-3271.
Orduz, "Evaluation Test Results of a New Distributed MPPT Converter", 22nd European Photovoltaic Solar Energy Conference, Sep. 3-7, 2007, Milan, Italy.
Palma, "A Modular Fuel Cell, Modular DC-DC Converter Concept for High Performance and Enhanced Reliability", IEEE 2007, pp. 2633-2638.
Quaschning, "Cost Effectiveness of Shadow Tolerant Photovoltaic Systems", Berlin University of Technology, Institute of Electrical Energy Technology, Renewable Energy Section. EuroSun '96, pp. 819-824.
Roman, "Intelligent PV Module for Grid-Connected PV Systems", IEEE Transactions on Industrial Electronics, vol. 52, No. 4, Aug. 2006, pp. 1066-1073.
Roman, "Power Line Communications in Modular PV Systems", 20th European Photovoltaic Solar Energy Conference, Jun. 6-10, 2005, Barcelona, Spain, pp. 2249-2252.
Uriarte, "Energy Integrated Management System for PV Applications", 20th European Photovoltaic Solar Energy Conference, Jun. 6-10, 2005, Barcelona, Spain, pp. 2292-2295.
Walker, "Cascaded DC-DC Converter Connection of Photovoltaic Modules", IEEE Transactions on Power Electronics, vol. 19, No. 4, Jul. 2004, pp. 1130-1139.
Matsui, et al., "A New Maximum Photovoltaic Power Tracking Control Scheme Based on Power Equilibrium at DC Link", IEEE, 1999, pp. 804-809.
Hou, et al., Application of Adaptive Algorithm of Solar Cell Battery Charger, Apr. 2004.
Stamenic, et al., "Maximum Power Point Tracking for Building Integrated Photovoltaic Ventilation Systems", 2000.
International Preliminary Report on Patentability for PCT/IB2008/055092 dated Jun. 8, 2010.
International Search Report for PCT/IB2008/055092 dated Sep. 8, 2009.
Walker, "Cascaded DC-DC Converter Connection of Photovoltaic Modules", 33rd Annual IEEE Power Electronics Specialists Conference. PESC 2002. Conference Proceedings. Cairns, Queensland, Australia, Jun. 23-27, 2002; [Annual Power Electronics Specialists Conference], New York, NY: IEEE US, vol. 1, Jun. 23, 2002, pp. 24-29, XP010596060 ISBN: 978-0-7803-7262-7, figure 1.
International Search Report and Opinion of International Patent Application WO2009136358 (PCT/IB2009/051831), dated Sep. 16, 2009.
Informal Comments to the International Search Report dated Dec. 3, 2009.
PCT/IB2010/052287 International Search Report and Written Opinion dated Sep. 2, 2010.
UK Intellectual Property office, Combined Search and Examination Report for GB1100450.4 under Sections 17 and 18 (3), Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.
Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.
Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.
Sandia Report SAND96-2797 I UC-1290 Unlimited Release, Printed Dec. 1996, "Photovoltaic Power Systems and The National Electrical Code: Suggested Practices", by John Wiles, Southwest Technology Development Institute New Mexico State University Las Cruces, NM.
United Kingdom Intellectual Property Office, Combined Search and Examination Report Under Sections 17 and 18(3), GB1020862.7, dated Jun. 16, 2011.
QT Technical Application Papers, "ABB Circuit-Breakers for Direct current Applications", ABB SACE S.p.A., An ABB Group Coupany, L.V. Breakers, Via Baioni, 35, 24123 Bergamo-Italy, Tel.: +39 035.395.111—Telefax: +39 035.395.306-433.

(56) References Cited

OTHER PUBLICATIONS

Woyte, et al., "Mains Monitoring and Protection in a European Context", 17th European Photovoltaic Solar Energy Conference and Exhibition, Munich, Germany, Oct. 22-26, 2001, ACHIM, WOYTE, et al., pp. 1-4.
"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.
Fairchild Semiconductor, Application Note 9016, IGBT Basics 1, by K.S. Oh Feb. 1, 2001.
"Disconnect Switches in Photovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.
Walker, "A DC Circuit Breaker for an Electric Vehicle Battery Pack", Australasian Universities Power Engineering Conference and IEAust Electric Energy Conference, Sep. 26-29, 1999.
Combined Search and Examination for GB1018872.0 dated Apr. 15, 2011, 2 pages.
Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.
Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.
Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1, pp. 233-236.
International Search Report and Opinion of International Patent Application PCT/2009/051221, dated Oct. 19, 2009.
Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.
Duarte, "A Family of ZVX-PWM Active-Clamping DC-to-DC Converters: Synthesis, Analysis and Experimentation", Telecommunications Energy Conference, 1995, INTELEC '95, 17th International The Hague, Netherlands, Oct. 29-Nov. 1, 1995, New York, NY, US, IEEE, US, Oct. 29, 1995, pp. 502-509, XP010161283 ISBN: 978-0-7803-2750-4 p. 503-504.
International Search Report and Opinion of International Patent Application PCT/2009/051222, dated Oct. 7, 2009.
Communication in EP07874025.5 dated Aug. 17, 2011.
IPRP for PCT/IB2008/055095 dated Jun. 8, 2010, with Written Opinion.
ISR for PCT/IB2008/055095 dated Apr. 30, 2009.
IPRP for PCT/IL2007/001064 dated Mar. 17, 2009, with Written Opinion dated Mar. 25, 2008.
ISR for PCT/IL07/01064 dated Mar. 25, 2008.
IPRP for PCT/IB2007/004584 dated Jun. 10, 2009, with Written Opinion.
IPRP for PCT/IB2007/004586 dated Jun. 10, 2009, with Written Opinion.
IPRP for PCT/IB2007/004591 dated Jul. 13, 2010, with Written Opinion.
IPRP for PCT/IB2007/004610 dated Jun. 10, 2009, with Written Opinion.
IPRP for PCT/IB2007/004643 dated Jun. 10, 2009, with Written Opinion.
Written Opinion for PCT/IB2008/055092 submitted with IPRP dated Jun. 8, 2010.
IPRP for PCT/US2008/085754 dated Jun. 8, 2010, with Written Opinion dated Jan. 21, 2009.
IPRP for PCT/US2008/085755 dated Jun. 8, 2010, with Written Opinion dated Jan. 20, 2009.
IPRP for PCT/IB2009/051221 dated Sep. 28, 2010, with Written Opinion.
IPRP for PCT/IB2009/051222 dated Sep. 28, 2010, with Written Opinion.
IPRP for PCT/IB2009/051831 dated Nov. 9, 2010, with Written Opinion.
IPRP for PCT/US2008/085736 dated Jun. 7, 2011, with Written Opinion.
IPRP for PCT/IB2010/052287 dated Nov. 22, 2011, with Written Opinion.
ISR for PCT/IB2010/052413 dated Sep. 7, 2010.
UK Intellectual Property Office, Application No. GB1109618.7, Patents Act 1977, Examination Report Under Section 18(3), Sep. 16, 2011.
UK Intellectual Property Office, Patents Act 1977: Patents Rules Notification of Grant: Patent Serial No. GB2480015, Nov. 29, 2011.
Chinese Office Action—CN Appl. 201410347742.1—dated Nov. 12, 2015.

\* cited by examiner

_US 9,748,897 B2_

ELECTRICALLY ISOLATED HEAT DISSIPATING JUNCTION BOX

CROSS REFERENCE TO RELATED APPLICATIONS

This application is a continuation of U.S. patent application Ser. No. 14/641,690 filed Mar. 9, 2015, which is a continuation of U.S. patent application Ser. No. 13/901,706 filed May 24, 2013 (now U.S. Pat. No. 9,006,569, issued on Apr. 14, 2015), which is a continuation of U.S. patent application Ser. No. 12/785,773 filed May 24, 2010 (now U.S. Pat. No. 8,476,524 issued on Jul. 2, 2013), which claims benefit from U.S. patent application 61/180,455 filed May 22, 2009. The disclosures of the above-identified applications are incorporated herein by reference for all purposes.

BACKGROUND

1. Technical Field

The present invention relates to a junction box for power sources, and specifically to a junction box for electrically connecting to a photovoltaic panel.

2. Description of Related Art

A photovoltaic module or photovoltaic panel is a packaged interconnected assembly of photovoltaic cells, also known as solar cells. Since a single photovoltaic module can only produce a limited amount of power, commercial installations include several modules or panels interconnected in serial and in parallel into a photovoltaic array. Electrical connections are made in series to achieve a desired output voltage and/or in parallel to provide a desired amount of current source capability. A photovoltaic installation typically includes the array of photovoltaic modules, an inverter, batteries and interconnection wiring.

When part of a photovoltaic module is shaded, the shaded cells do not produce as much current as the unshaded cells. Since photovoltaic cells are connected in series, the same amount of current must flow through every serially connected cell. The unshaded cells force the shaded cells to pass more current. The only way the shaded cells can operate at a higher current is to operate in a region of negative voltage that is to cause a net voltage loss to the system. The current times this negative voltage gives the negative power produced by the shaded cells. The shaded cells dissipate power as heat and cause "hot spots". Bypass diodes are therefore integrated with the photovoltaic modules to avoid overheating of cells in case of partial shading of the photovoltaic module.

Blocking diodes may be placed in series with cells or modules to block reverse leakage current backwards through the modules such as to block reverse flow of current from a battery through the module at night or to block reverse flow down damaged modules from parallel-connected modules during the day.

Electronic modules may be integrated with the photovoltaic modules which perform electrical conversion, e.g. direct current (DC) to direct current conversion, electrical inversion, e.g. micro-inverter, or other functions such as monitoring of performance and/or protection against theft.

U.S. Pat. No. 7,291,036 discloses a photovoltaic connection system including a connection box with for surface mounted diodes mounted on a printed circuit board inside of the connection box. The connection box optionally includes a metal plate mounted inside the lid of the connection box as a heat sink for dissipating heat from the diodes.

The term "cable gland" as used herein refers to a device used for the entry of electrical cables or cords into electrical equipment and is used to firmly secure an electrical cable entering a piece of electrical equipment.

The term "in situ" in the context of the present invention refers to bonding or attaching during manufacture, e.g. injection molding, of a part as opposed to attaching after manufacture of the part.

BRIEF SUMMARY

According to an aspect of the present invention there is provided a junction box used for making electrical connections to a photovoltaic panel. The junction box has two chambers including a first chamber and a second chamber and a wall common to and separating both chambers. The wall may be adapted to have an electrical connection therethrough. The two lids are adapted to seal respectively the two chambers. The two lids are configured to be on opposite sides of the junction box relative to the photovoltaic panel. The two lids may be attachable using different sealing processes. One of the lids may be adapted to seal the first chamber and the other lid may seal the second chamber to a different level of hermeticity from that of the first chamber. The first chamber may be adapted to receive a circuit board for electrical power conversion of the power output of the photovoltaic panel. The junction box may include supports for mounting a printed circuit board in the first chamber. The second chamber is configured for electrical connection to the photovoltaic panel. The second chamber may optionally be configured to include diodes, e.g. bypass and/or blocking diodes. The junction box may have electrical connection terminals mounted inside the second chamber for connecting a circuit to the photovoltaic panel. A metal heat sink may be bonded inside the first chamber. The first chamber is adapted to receive a circuit board for electrical power conversion, and the metal heat sink is adapted to dissipate heat generated by the circuit board. The heat sink is placed inside an injection mold during manufacture of the junction box. The junction box may further include a pad adapted to provide thermal conduction and electrical insulation between the circuit board and the metal heat sink. The metal heat sink may include a dovetail structure adapted to prevent mutual separation of the metal heat sink from the junction box. The dovetail structure may be hollow.

According to an aspect of the present invention there is provided a junction box used for making electrical connections to a photovoltaic panel. The junction box has a metal heat sink bonded in situ inside the first chamber. The first chamber is adapted to receive a circuit board for electrical power conversion, and the metal heat sink is adapted to dissipate heat generated by the circuit board. The junction box optionally may have two chambers including a first chamber and a second chamber and a wall common to and separating both chambers. Two lids may be adapted to seal respectively the two chambers. The metal heat sink may include a dovetail structure adapted to prevent mutual separation of the metal heat sink from the junction box. The wall may have an electrical connection therethrough

BRIEF DESCRIPTION OF THE DRAWINGS

Aspects of the invention are herein described, by way of example only, with reference to the accompanying drawings, wherein.

Figure 1A:
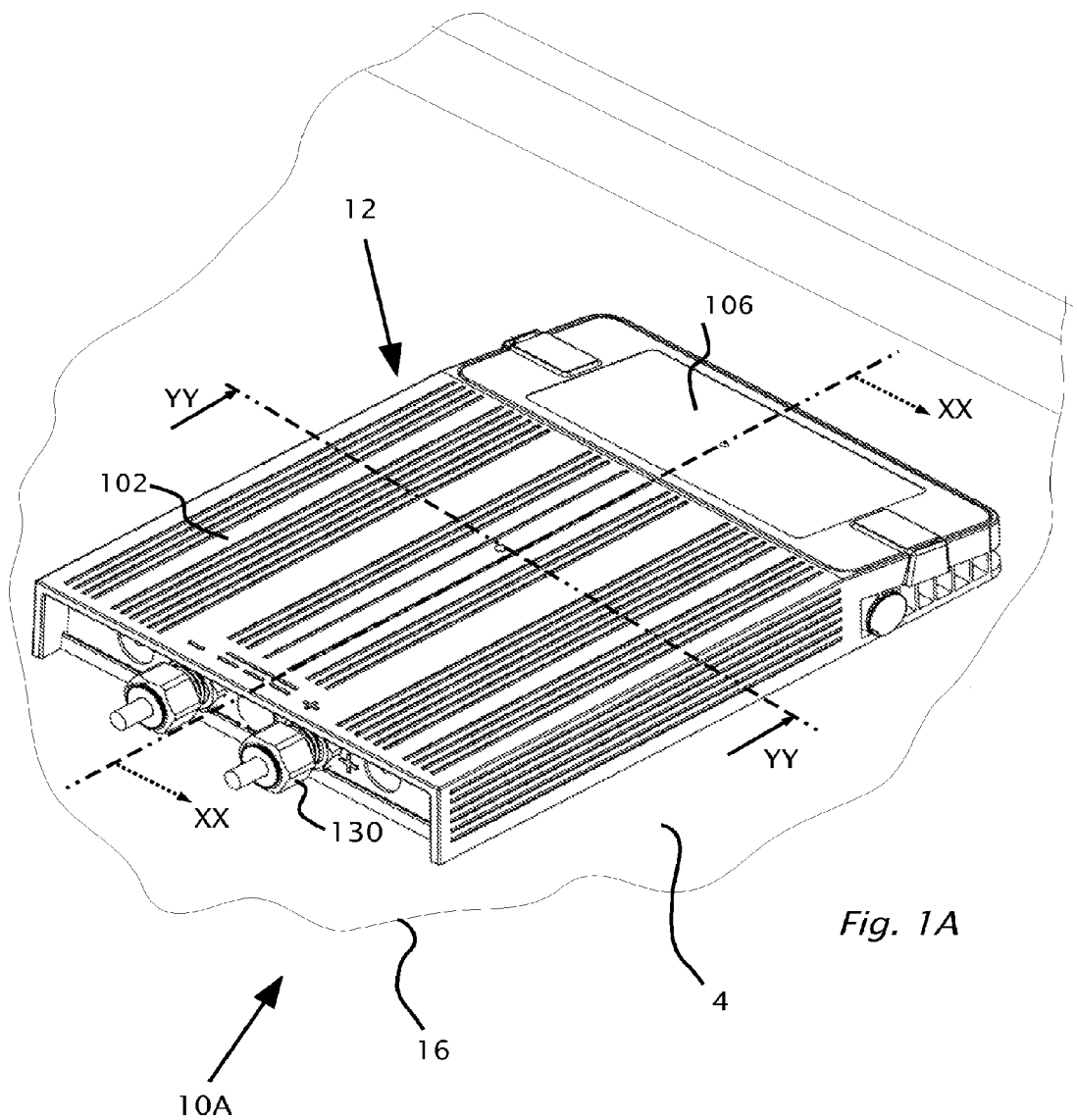
FIGS. 1A and 1B illustrate isometric views of a junction box, according to an embodiment of the present invention.

The foregoing and/or other aspects will become apparent from the following detailed description when considered in conjunction with the accompanying drawing figures.

DETAILED DESCRIPTION

Reference will now be made in detail to embodiments of the present invention, examples of which are illustrated in the accompanying drawings, wherein like reference numerals refer to the like elements throughout. The embodiments are described below to explain the present invention by referring to the figures.

By way of introduction, diodes and/or electronic modules within junction boxes attached to the photovoltaic modules dissipate heat. When insulating junction boxes are used, heat must be dissipated mostly through air inside the junction box. When metallic junction boxes are used then heat may be dissipated directly through the junction box. However, the use of a metallic junction boxes may be inconvenient because of regulations which require accessible metallic surfaces to be grounded and extra wiring is required.

Before explaining exemplary embodiments of the invention in detail, it is to be understood that the invention is not limited in its application to the details of design and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Referring now to the drawings, FIG. 1A shows an isometric view 10A of a junction box 12, according to an embodiment of the present invention. Junction box 12 is shown mounted on the back (or non-photovoltaic side) 4 of a photovoltaic panel 16. Junction box 12 has cable glands 130 which allow for termination of cables inside of junction box 12. Junction box 12 has an outer casing 102 and an access into junction box 12 using a lid 106.

Figure 1B:
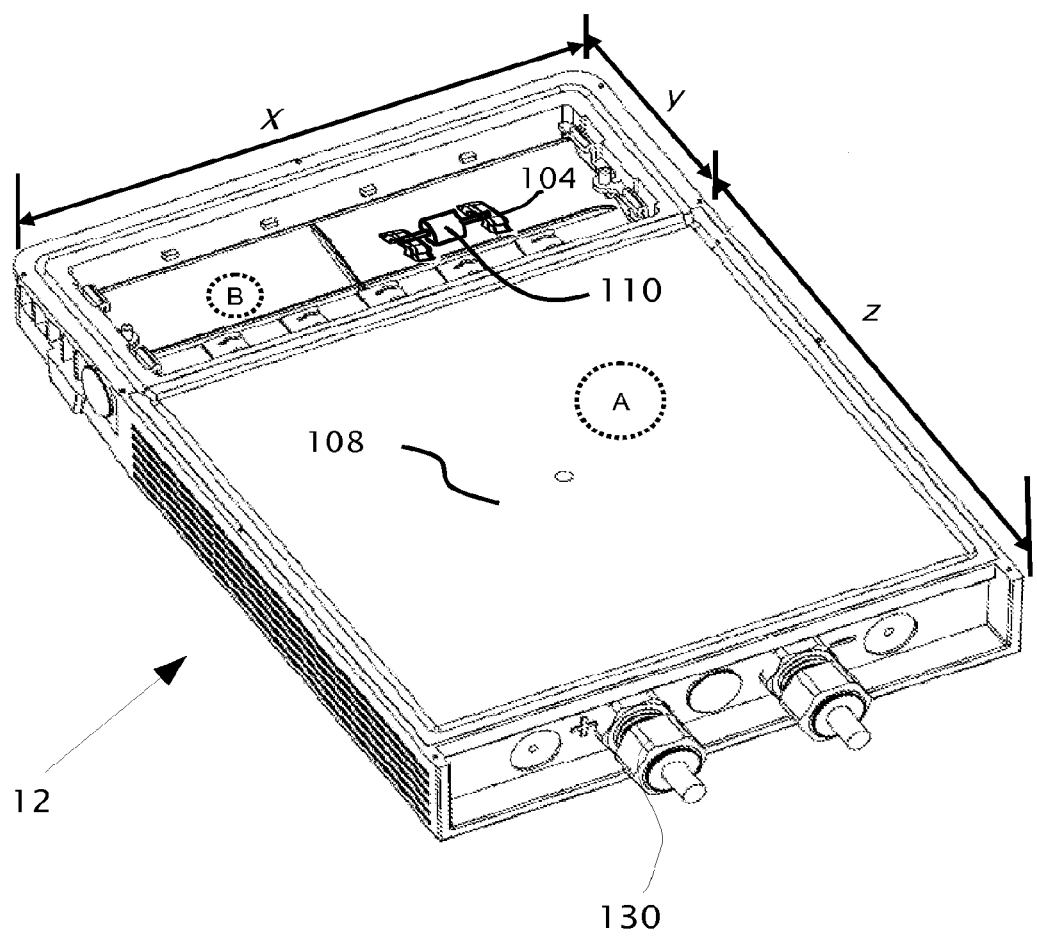

FIG. 1B shows an isometric view of the underside of junction box 12 detached from photovoltaic panel 16. The isometric view shows glands 130 and two sections A and B of junction box 12. chamber A is bounded by the dimensions Z×X with chamber A covered by lid 108. Lid 108 gives access into chamber A of junction box 12. Chamber B is an open section which is bounded by dimensions X×Y and shows terminals 104. A bypass diode 110 is connected between terminals 104. According to a feature of the present invention, lid 106 removed to access chamber B and lid 108 used to access chamber A are on opposite sides of junction box 12.

Figure 2A:
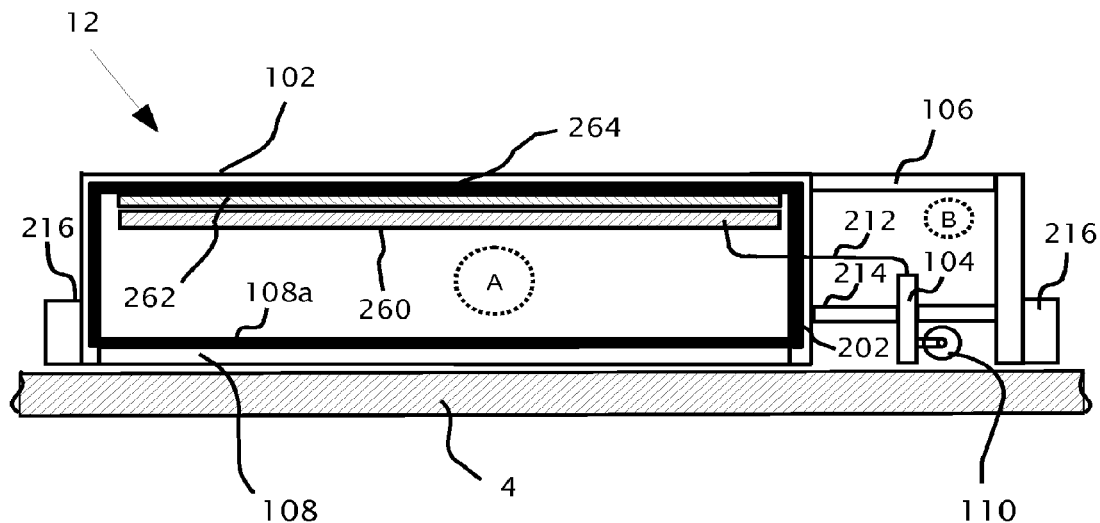
FIG. 2A shows details of cross section of the junction box indicated by dotted line XX in FIG. 1A.

FIG. 2A shows details of cross section XX of junction box 12 indicated by dotted line in FIG. 1A, showing features of the present invention. Cross section XX shows chamber sections A and B of junction box 12 mounted on non-photovoltaic side 4 of photovoltaic panel 16 with clips 216. The mechanical attachment between junction box 12 and photovoltaic panel 16 using clips 216 is such that junction box 12 is flat on photovoltaic panel 16 and a gasket may be used to seal the open end of chamber B.

Chamber A includes circuit board 260, thermally conductive pad 262, heat sink 264, outer casing 102 and lid 108. Circuit board 260 is preferably mounted on supports adapted to receive circuit board 260. Thermal pad 262 provides electrical isolation and thermal conductivity between heat sink 264 and circuit board 260. The component side of circuit board 260 is preferably in contact with thermal pad 262 so that heat created by the components of circuit board 260 is dissipated by heat sink 264 via thermal pad 262. Radio Frequency Interference (RFI) emission from junction box 12 as a result of the operation of circuit board 260 is reduced by having the side of lid 108 coated in an electrically conductive shielding 108a. Shielding 108a connects electrically to heat sink 264 to form a Faraday cage which suppresses RFI emission from junction box 12.

Lid 108 according to an aspect of the present invention is preferably manufactured by an injection molding process. During the injection molding process of lid 108 a shield 108a may be placed in situ and bonded to lid 108 during the injection molding process. Thus, when lid 108 is attached to box chamber A; junction box 12 is electrically isolated by heat sink 264 and shield 108a. Outer casing 102 and lid 108 additionally provide a non-electrically conductive isolation of heat sink 264 and shield 108a between the backside 4 of panel 16 and the exterior of junction box 12. Lid 108 is optionally permanently and/or hermetically sealed to chamber A.

Chamber B includes terminal 104, support 214, bypass diode 110, lid 106, bus bar 212 and wall 202. Wall 202 provides physical separation between chambers A and B. Electrical connectivity between circuit board 260 in chamber A and electrical connector 104 in chamber B is via bus bar 212. Bus bar 212 is sealed in wall 202 in such a way as to preserve the desired hermeticity of chamber A for example against the ingress of water or humidity. Both electrical connector 104 and bus bar 212 are supported mechanically by support 214. Support 214 may also provide hermetic sealing and/or electrical isolation between one end of connector 104 which connects to bus bar 212 and the other end of connector 104 which connects to connections provided by photovoltaic panel 16. Bypass diode 110 connected to connector 104 may be located between support 214 or backside 4 of panel 16 or between support 214 and lid 106. Lid 106 gives access to chamber B whilst junction box 12 is physically attached photovoltaic panel 16 but electrically isolated from panel 16. A preferred mechanism of attaching lid 106 to junction box 12 is to use a rubber gasket arrangement such that chamber B is hermetically sealed against for example the ingress of water/humidity through lid 106 into chamber B.

According to another embodiment of the present invention, junction box 12 is constructed with a wall 202 that may be a double wall so that chamber A and chamber B are mutually separable and re-attachable. Similarly, bus bar 212 is re-connectable between chamber A and chamber B. In this embodiment, a failure within the electronics of circuit board 260 may be repaired by replacing chamber A with a new circuit board 260 without requiring disconnection of chamber B from photovoltaic panel 16. Similarly, an electronics upgrade may be easily achieved.

Junction box 12 including casing 102, lids 108/106, heat sink 264, and thermal pad 262 are preferably adapted to comply with temperature and insulation standard of IEC 61215 (Ed. 2) or other applicable industry standards for use with connection to photovoltaic panels. Junction box 12 and lids 108/106 may be manufactured by injection molding of acrylonitrile butadiene styrene (ABS) thermoplastic, Polybutylene terephthalate (PBT), Poly(p-phenylene oxide) (PPO) or a thermoset such as epoxy resin.

Figure 2B:
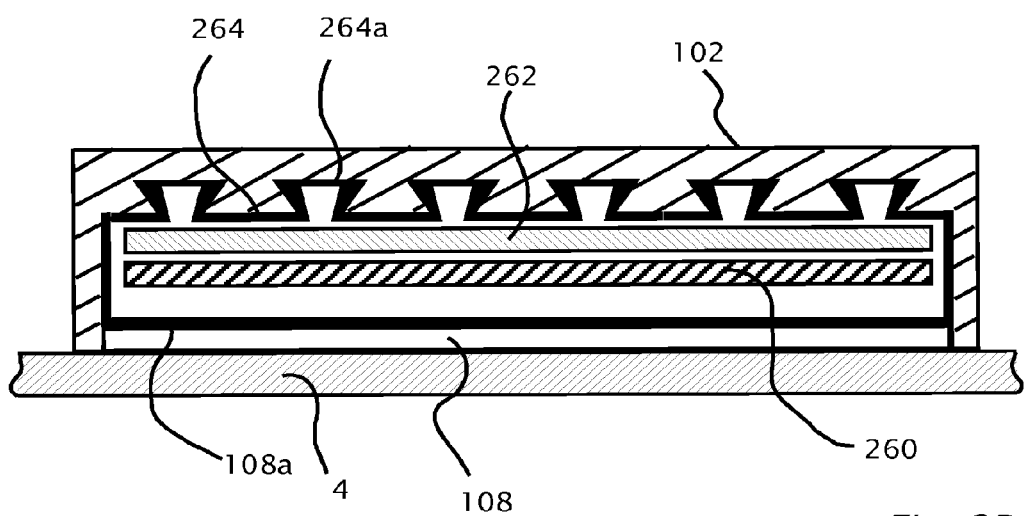
FIG. 2B shows details of cross section YY of the junction box indicated by dotted line in FIG. 1A.

FIG. 2B shows details of cross section YY of junction box 12 indicated by dotted line in FIG. 1A, according to an embodiment of the present invention. Cross section YY is of chamber A mounted on backside 4 of photovoltaic panel 16. Cross section YY shows outer casing 102, heat sink 264 with dovetail structure 264a, thermally conductive pad 262, circuit board 260 and lid 108 with electrical shield 108a.

The manufacture of box chamber sections A and B of junction box 12 in a preferred embodiment of the present invention is by an injection molding process. During the injection molding process heat sink 264 with or without dovetail structure 264a is placed inside box chamber A and is bonded in situ to box chamber A as a result of the injection molding process.

Additional strength of the bonding between heat sink 264 and box chamber A may be provided by a dovetail structure 264a which may be an integral part of heat sink 264. A further function of dovetail structure 264a ensures that the bonding between heat sink 264 and chamber A remains intact when for example junction box 12 is subjected to thermal stresses as a result of electronic components operating inside chamber A, high ambient heat and sunlight when junction box 12 attached to a photovoltaic panel. Where a fastener, e.g. screw is used to fasten chamber A to heat sink 264, the lateral dimensions of dovetail structure 264a is typically increased in order to accommodate the size of the fastener. A further feature of dovetail structure 264a is a hollow structure within dovetail structure 264a which allows for a deformation of dovetail structure 264a. The deformation of dovetail structure 264a allows for the different rates of thermal expansion of enclosure 102 and heat sink 264/dovetail structure 264a during the curing/cooling of the bond between heat sink 264 and enclosure 102 of chamber A.

Figure 3A:
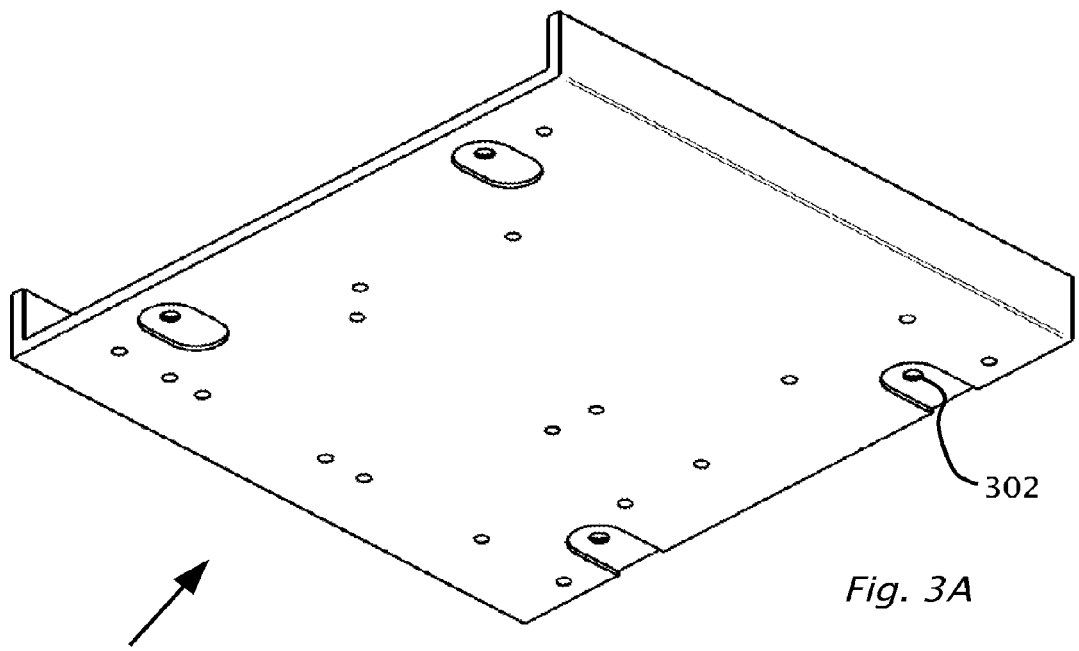
FIGS. 3A and 3B show isometric views of a heat sink according to another embodiment of the present invention.
Figure 3B:
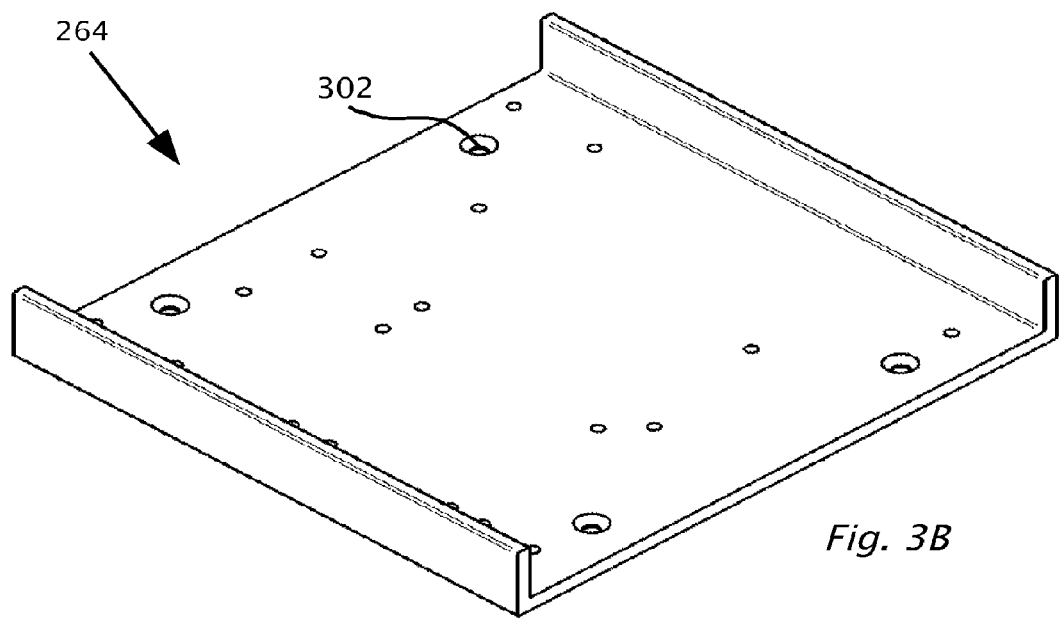

Reference is now made to FIGS. 3A and 3B which show isometric views of heat sink 264 according to another embodiment of the present invention. Heat sink 264 has four holes 302. Holes 302 are used to attach heat sink 264 into chamber A of junction box 12 using screws. The attachment of heat sink to chamber A may come as an additional step after the injection molding of junction box 12 or of a junction box 12 which is not injection molded. An additional thermal pad may be placed between heat sink 264 and enclosure 102 to ensure good contact between heat sink 264 and enclosure 102 after heat sink 264 is attached enclosure 102. The deformable nature of the thermal pad used to accommodate non-uniformity in surfaces of the heat sink 264 and enclosure 102 due to manufacturing tolerances of heat sink 264/enclosure 102. Alternatively a thermally conducting glue or potting material may be placed between heat sink 264 and enclosure 102.

The articles "a" "an" as used herein mean "one or more" such as "a heat-sink", "a circuit board" have the meaning of "one or more" that is "one or more heat-sinks" or "one or more circuit boards".

Although selected embodiments of the present invention have been shown and described, it is to be understood the present invention is not limited to the described embodiments. Instead, it is to be appreciated that changes may be made to these embodiments without departing from the principles and spirit of the invention, the scope of which is defined by the claims and the equivalents thereof.

The invention claimed is:

1. A junction box comprising:
   a first chamber sealed with a first level of hermeticity by a first lid;
   a second chamber sealed with a second level of hermeticity by a second lid, the first level of hermeticity being different than the second level of hermeticity;
   a circuit board within the first chamber and designed to convert electrical power received from a photovoltaic panel to at least one of a DC voltage or an AC voltage;
   an electrical connection within the second chamber and designed to receive the electrical power from the photovoltaic panel; and
   a wall to separate the first chamber and the second chamber, wherein the wall allows for mutual separation and reattachment of the first chamber and second chamber.

2. The junction box of claim 1, wherein the first chamber is configured to disconnect from the photovoltaic panel without disconnecting the second chamber from the photovoltaic panel.

3. The junction box of claim 1, wherein a side of the second chamber is configured to attach to the photovoltaic panel.

4. The junction box of claim 1, further comprising a re-connectable second electrical connection that connects the circuit board in the first chamber to the electrical connection in the second chamber.

5. The junction box of claim 1, further comprising a gasket configured to seal an open end of the second chamber.

6. The junction box of claim 1, wherein the second chamber further comprises one or more bypass diodes.

7. The junction box of claim 1, wherein the second chamber further comprises a terminal connecting the electrical connection to the photovoltaic panel.

8. A junction box comprising:
   a first portion forming a first chamber comprising a circuit board designed to convert electrical power received from a photovoltaic panel to at least one of a DC voltage or an AC voltage, the first portion being configured to attach to a second portion forming a second chamber designed to receive the electrical power from the photovoltaic panel; and a wall to separate the first chamber and the second chamber, wherein the wall allows for mutual separation and reattachment of the first chamber and second chamber, wherein the first chamber is hermetically sealed by a first lid separately from the second chamber and the second chamber is hermetically sealed by a second lid.

9. The junction box of claim 8, wherein the first chamber is configured to disconnect from the photovoltaic panel without disconnecting the second chamber from the photovoltaic panel.

10. The junction box of claim 8, wherein the first chamber has a level of hermeticity that is different than a level of hermeticity of the second chamber.

11. A junction box comprising:
   a first chamber hermetically sealed by a first lid;
   a second chamber hermetically sealed by a second lid;
   an electrical connection within the second chamber designed to receive electrical power from a photovoltaic panel;
   a circuit board within the first chamber designed to receive power from the electrical connection of the second chamber; and a wall to separate the first chamber and the second chamber, wherein the wall allows for mutual separation and reattachment of the first chamber and second chamber, wherein the first chamber is hermetically sealed separately from the second chamber.

12. The junction box of claim 11, wherein the first chamber is sealed with a first level of hermeticity and the second chamber is sealed with a second level of hermeticity different than the first level of hermeticity.

13. The junction box of claim 11, further comprising the photovoltaic panel.

14. The junction box of claim 11, wherein the first chamber is configured to disconnect from the photovoltaic panel without disconnecting the second chamber from the photovoltaic panel.

15. The junction box of claim 11, wherein a wall of the second chamber provides a non-electrically conductive isolation between the photovoltaic panel and the junction box.

16. The junction box of claim 11, wherein the first chamber further comprises cable glands.

17. The junction box of claim 11, wherein the first lid is adapted to seal the first chamber from ingress of water or humidity.

* * * * *